(12) United States Patent
Lee et al.

(10) Patent No.: US 9,364,914 B2
(45) Date of Patent: Jun. 14, 2016

(54) APPARATUS AND METHOD OF ATTACHING SOLDER BALL AND METHOD OF FABRICATING SEMICONDUCTOR PACKAGE INCLUDING SOLDER BALL

(71) Applicant: SAMSUNG ELECTRONICS CO., LTD., Suwon-si (KR)

(72) Inventors: Seokhyun Lee, Hwaseong-si (KR); Jaegwon Jang, Hwaseong-si (KR); Chul-Yong Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/471,327

(22) Filed: Aug. 28, 2014

(65) Prior Publication Data
US 2015/0125999 A1    May 7, 2015

(30) Foreign Application Priority Data
Nov. 7, 2013    (KR) ............... 10-2013-0134928

(51) Int. Cl.
*H01L 23/02* (2006.01)
*B23K 3/06* (2006.01)
(Continued)

(52) U.S. Cl.
CPC ............ *B23K 3/0623* (2013.01); *B23K 1/0016* (2013.01); *B23K 1/203* (2013.01); *H01L 21/4853* (2013.01); *H01L 23/49816* (2013.01); *H01L 24/97* (2013.01); *H01L 25/105* (2013.01); *H01L 25/50* (2013.01); *H01L 23/3128* (2013.01); *H01L 24/16* (2013.01); *H01L 24/32* (2013.01); *H01L 24/48* (2013.01); *H01L 24/73* (2013.01); *H01L 24/92* (2013.01); *H01L 25/0657* (2013.01); *H01L 2224/0401* (2013.01); *H01L 2224/04042* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/48228* (2013.01); *H01L 2224/73204* (2013.01); *H01L 2224/73265* (2013.01); *H01L 2224/92125* (2013.01); *H01L 2224/97* (2013.01); *H01L 2225/0651* (2013.01);
(Continued)

(58) Field of Classification Search
CPC ......... H01L 21/50; H01L 24/16; H01L 24/32; H01L 24/48
USPC .................... 438/107; 156/367; 257/E21.49, 257/E21.499
See application file for complete search history.

(56) References Cited

U.S. PATENT DOCUMENTS 7,331,500 B2    2/2008    Martin et al.
7,514,351 B2    4/2009    Sakaguchi
(Continued)

FOREIGN PATENT DOCUMENTS

JP    2000-003926 A    1/2000
JP    2011-192767 A    9/2011
(Continued)

*Primary Examiner* — Michael Lebentritt
(74) *Attorney, Agent, or Firm* — Sughrue Mion, PLLC

(57) ABSTRACT

Provided are apparatuses configured to attach a solder ball, methods of attaching a solder ball, and methods of fabricating a semiconductor package including the same. An apparatus configured to attach a solder ball includes a chuck configured to receive a package substrate on which solder balls are provided; a shielding mask configured to shield the package substrate and including holes configured to expose the solder balls; and a heater configured to melt the solder balls exposed through the holes.

10 Claims, 13 Drawing Sheets

(51) Int. Cl.
*B23K 1/00* (2006.01)
*B23K 1/20* (2006.01)
*H01L 23/498* (2006.01)
*H01L 25/10* (2006.01)
*H01L 25/00* (2006.01)
*H01L 21/48* (2006.01)
*H01L 23/31* (2006.01)
*H01L 23/00* (2006.01)
*H01L 25/065* (2006.01)

(52) U.S. Cl.
CPC ........... *H01L 2225/06568* (2013.01); *H01L 2225/1023* (2013.01); *H01L 2225/1058* (2013.01); *H01L 2924/00014* (2013.01); *H01L 2924/1431* (2013.01); *H01L 2924/1434* (2013.01); *H01L 2924/1436* (2013.01); *H01L 2924/15311* (2013.01); *H01L 2924/15331* (2013.01); *H01L 2924/181* (2013.01); *H01L 2924/1815* (2013.01); *H01L 2924/18161* (2013.01); *H01L 2924/351* (2013.01); *H01L 2924/37001* (2013.01)

(56) References Cited

U.S. PATENT DOCUMENTS

| | | | |
|---|---|---|---|
| 8,317,077 | B2 | 11/2012 | Hwang et al. |
| 8,525,072 | B2 | 9/2013 | Nakai et al. |
| 2002/0064930 | A1 | 5/2002 | Ishikawa |
| 2005/0284920 | A1 | 12/2005 | Martin et al. |
| 2008/0102620 | A1 | 5/2008 | Sakaguchi |
| 2009/0137084 | A1* | 5/2009 | Kida ............... H01L 24/16 438/107 |
| 2010/0206854 | A1 | 8/2010 | Nakai et al. |
| 2012/0111922 | A1 | 5/2012 | Hwang et al. |

FOREIGN PATENT DOCUMENTS

| | | |
|---|---|---|
| KR | 10-0788191 B1 | 1/2008 |
| KR | 10-1142437 B1 | 5/2012 |
| KR | 10-1144487 B1 | 5/2012 |

* cited by examiner

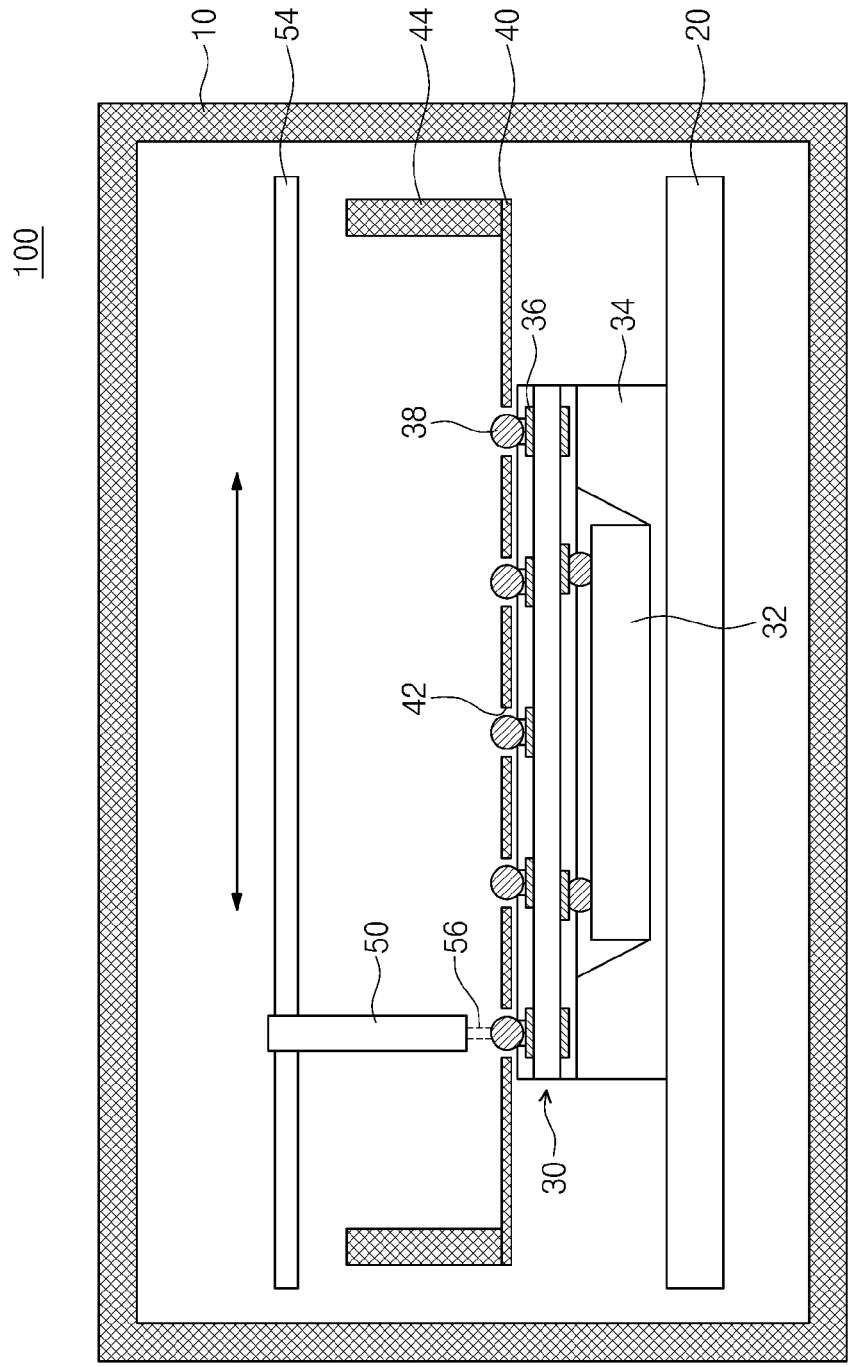

APPARATUS AND METHOD OF ATTACHING SOLDER BALL AND METHOD OF FABRICATING SEMICONDUCTOR PACKAGE INCLUDING SOLDER BALL

CROSS-REFERENCE TO RELATED APPLICATION

This application claims priority under 35 U.S.C. §119 to Korean Patent Application No. 10-2013-0134928, filed on Nov. 7, 2013, in the Korean Intellectual Property Office, the disclosure of which is hereby incorporated by reference in its entirety.

BACKGROUND

The exemplary embodiments relate to apparatuses and methods of attaching a solder ball, and methods of fabricating a semiconductor package including a solder ball.

High performance, high speed and small electronic components have been increasingly demanded with the development of electronics in the electronics industry. Ball grid array (BGA) type packaging techniques (e.g., a flip-chip BGA type packaging technique) are widely used in order to satisfy these demands. The ball grid array may include solder balls bonded to a bottom surface of a package substrate. The package substrate may be mounted on a printed circuit board (PCB) with the solder ball therebetween. These ball grid array-type package techniques may increase the number and a density of pins of a semiconductor package. Solder balls may also be used in order to connect an upper semiconductor package to a lower semiconductor package in a package-on-package device.

SUMMARY

Exemplary embodiments may provide apparatuses configured to attach a solder ball, which can reduce power consumption.

Exemplary embodiments may also provide methods of attaching a solder ball, which can reduce thermal damage of a semiconductor chip.

Exemplary embodiments may also provide methods of fabricating a semiconductor package, which can increase a yield.

According to an aspect of an exemplary embodiment, there may be provided an apparatus configured to attach a solder ball, the apparatus including: a chuck configured to receive a package substrate on which solder balls are provided; a shielding mask configured to shield the package substrate and comprising holes configured to expose the solder balls; and a heater configured to melt the solder balls exposed through the holes.

According to an aspect, the heater may be a light generator configured to emit a laser beam, an infrared ray, or a visible ray. The shielding mask may be configured to reflect light. The shielding mask may include at least one of nickel, iron, stainless steel, silver, and titanium.

According to an aspect, the heater may include a heating coil. The shielding mask may include a heat resistant material.

According to an aspect, the heater may have a plate-shape covering an entire portion of the package substrate.

According to an aspect, the heater may have a nail-shape or a linear shape crossing the package substrate. The heater may be configured to be moved from one edge to another edge of the package substrate over the package substrate.

According to an aspect, the chuck may be an electrostatic chuck or a vacuum chuck.

According to another aspect of an exemplary embodiment, there may be provided a method of attaching a solder ball, the method including: providing solder balls on a package substrate including ball lands; providing a shielding mask on the package substrate, the shielding mask covering the package substrate and including holes exposing the solder balls; and melting the solder balls exposed through the holes by a heater configured to bond the solder balls to the ball lands.

According to an aspect, the attaching method may further include: coating a flux agent on surfaces of the solder balls before performing the melting of the solder balls.

According to still another aspect of an exemplary embodiment, there may be provided a method of fabricating a semiconductor package, the method including: mounting a semiconductor chip on a package substrate including ball lands; and bonding solder balls to the ball lands by: providing a shielding mask on the package substrate, the shielding mask covering the package substrate and including holes exposing the solder balls; and melting the solder balls exposed through the holes by a heater configured to bond the solder balls to the ball lands.

According to an aspect, the fabricating method may further include: forming a mold layer covering the semiconductor chip and the package substrate.

According to an aspect, the semiconductor chip may be a memory chip.

BRIEF DESCRIPTION OF THE DRAWINGS

The exemplary embodiments will become more apparent in view of the attached drawings and accompanying detailed description.

FIG. 1A is a cross-sectional view illustrating an apparatus configured to attach a solder ball according to an exemplary embodiment;

DETAILED DESCRIPTION OF THE EXEMPLARY EMBODIMENTS

Figure 1B:
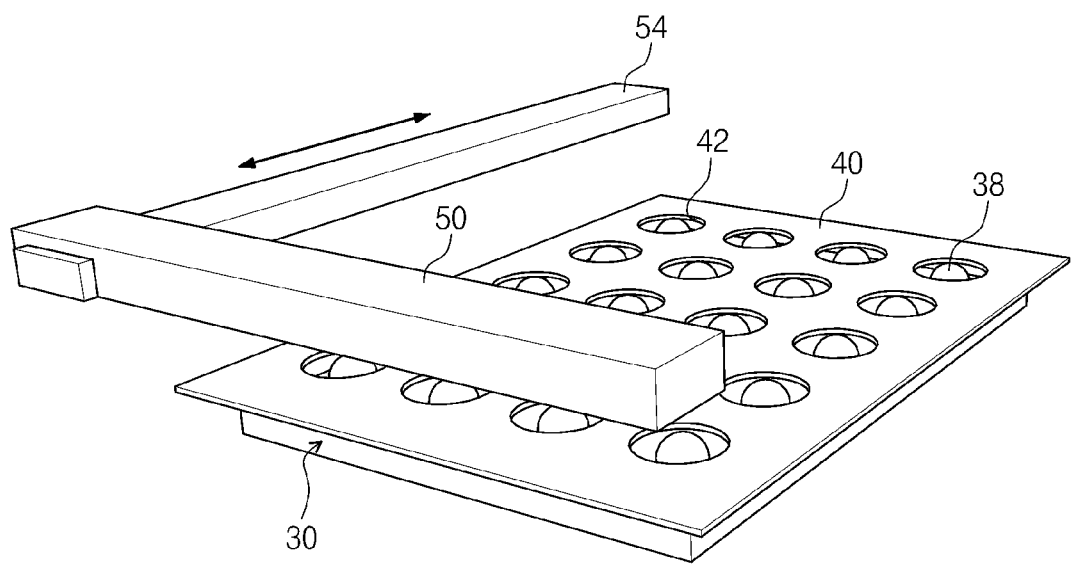
FIG. 1B is a perspective view illustrating a portion of an apparatus configured to attach a solder ball according to an exemplary embodiment.

The exemplary embodiments will now be described more fully hereinafter with reference to the accompanying drawings, in which exemplary embodiments are shown. The advantages and features of the exemplary embodiments and methods of achieving the exemplary embodiments will be apparent from the following exemplary embodiments that will be described in more detail with reference to the accompanying drawings. It should be noted, however, that the exemplary embodiments are not limited to the following exemplary embodiments, and may be implemented in various forms. Accordingly, the exemplary embodiments are provided only to disclose the exemplary embodiments and inform those skilled in the art of the category of the exemplary embodiments. In the drawings, exemplary embodiments are not limited to the specific examples provided herein and are exaggerated for clarity.

The terminology used herein is for the purpose of describing particular exemplary embodiments only and is not intended to limit the exemplary embodiments. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, the element may be directly connected or coupled to the other element or intervening elements may be present.

Similarly, it will be understood that when an element such as a layer, region or substrate is referred to as being "on" another element, the element can be directly on the other element or intervening elements may be present. In contrast, the term "directly" indicates that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the exemplary embodiments in the detailed description will be described with sectional views as ideal exemplary views of the exemplary embodiments. Accordingly, shapes of the exemplary views may be modified according to manufacturing techniques and/or allowable errors. Therefore, the exemplary embodiments are not limited to the specific shapes illustrated in the exemplary views, but may include other shapes that may be created according to manufacturing processes. Areas exemplified in the drawings have general properties, and are used to illustrate specific shapes of elements. Thus, the drawings should not be construed as limiting the scope of the exemplary embodiments.

It will be also understood that although the terms first, second, third, etc. may be used herein to describe various elements, these elements should not be limited by these terms. These terms are only used to distinguish one element from another element. Thus, a first element in some exemplary embodiments could be termed a second element in other exemplary embodiments without departing from the teachings of the exemplary embodiments. Aspects of exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the exemplary embodiments.

FIG. 1A is a cross-sectional view illustrating an apparatus configured to attach a solder ball according to an exemplary embodiment. FIG. 1B is a perspective view illustrating a portion of an apparatus configured to attach a solder ball according to an exemplary embodiment.

Referring to FIGS. 1A and 1B, an apparatus 100 configured to attach a solder ball according to the present exemplary embodiment includes a chuck 20 disposed in a chamber 10, a shielding mask 40, and a heating unit 50 (e.g., heater). The chuck 20 receives a package substrate 30 in the chamber 10. The chuck 20 may be an electrostatic chuck or a vacuum chuck. The shielding mask 40 includes holes 42 respectively corresponding to positions of solder balls 38 placed on the package substrate 30. The shielding mask 40 is connected to a first guide 44. A position of the shielding mask 40 may be moved and fixed by the first guide 44. In the present exemplary embodiment, the first guide 44 may be spaced apart from the chuck 20. The heating unit 50 may be moved along a second guide 54.

In some exemplary embodiments, the heating unit 50 may be a light generating unit (e.g., light generator) configured to emit at least one of a laser beam, an infrared ray, and a visible ray. A cross section of the heating unit 50 may have a nail-shape or may have a linear shape crossing the package substrate 30 as illustrated in FIG. 1B. Thus, an irradiation surface of light 56 (e.g., the laser beam, the infrared ray and/or the visible ray) generated from a bottom portion of the heating unit 50 may be narrow like the nail-shape or may have a linear shape. The shielding mask 40 may have a property of shielding light. Additionally, the shielding mask 40 may also have a property of reflecting light. Thus, the shielding mask 40 may not absorb the light 56 generated from the heating unit 50. As a result, exemplary embodiments make it possible to prevent the shielding mask 40 from being heated by the light 56. Moreover, the shielding mask 40 may have excellent formability. Thus, the holes 42 may be easily formed in the shielding mask 40. Furthermore, the shielding mask 40 may have a low rate of expansion. Thus, even though the shielding mask 40 is heated by the light 56, the shape of the shield mask 40 may not be transformed. For example, the shielding mask 40 may include a metal such as nickel, iron, stainless steel, silver, and/or titanium. In some exemplary embodiments, the shielding mask 40 may be formed of an alloy of nickel and iron. In other exemplary embodiments, a reflecting sheet plate of a liquid crystal display device may be used as the shielding mask 40.

In other exemplary embodiments, the heating unit 50 may be a heat generating unit. In this case, the heating unit 50 may include a heating coil. Heat may be generated from a bottom portion of the heating unit 50. The heat may be transmitted to the solder ball 38 through the hole 42 to melt the solder ball 38. In this case, the shielding mask 40 may include a heat resistant material.

In still other exemplary embodiments, the heating unit 50 may generate a flame. In this case, the shielding mask 40 may include a flame resistant material.

Since the apparatus 100 configured to attach a solder ball according to an exemplary embodiment selectively melts only the solder ball 38 using the shielding mask 40 and the heating unit 50, power consumption of the apparatus 100 may be reduced as compared with a hot air type apparatus using a thermal convection effect caused by a heater heating air and a fan. Additionally, the apparatus 100 does not use nitrogen, in contrast to the hot air type apparatus which uses nitrogen. Thus, the apparatus 100 does not incur a cost associated with using the nitrogen, and the apparatus 100 does not require pipes for the nitrogen. As a result, a size of the apparatus 100 may be reduced. Moreover, the apparatus 100 does not require a conveyor belt, in contrast to the hot air type apparatus which uses a conveyor belt. Thus, exemplary embodiments make it possible to prevent failures in positioning of solder balls, which are caused by vibration of the conveyor belt.

A method of attaching a solder ball using the apparatus 100 of FIGS. 1A and 1B will be described hereinafter.

Figure 2A:
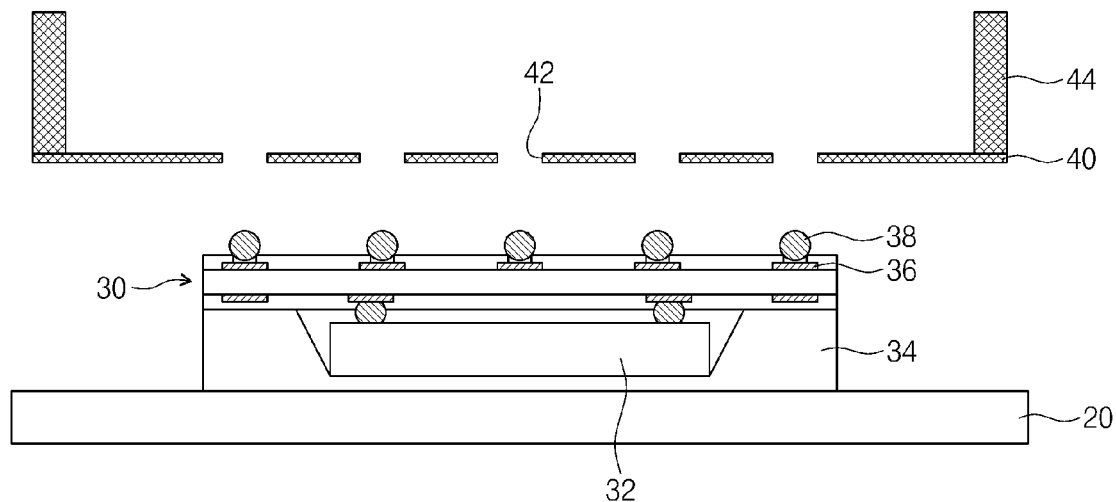
FIGS. 2A, 3A and 4A are cross-sectional views illustrating a method of operating the apparatus configured to attach a solder ball of FIG. 1A.
Figure 2B:
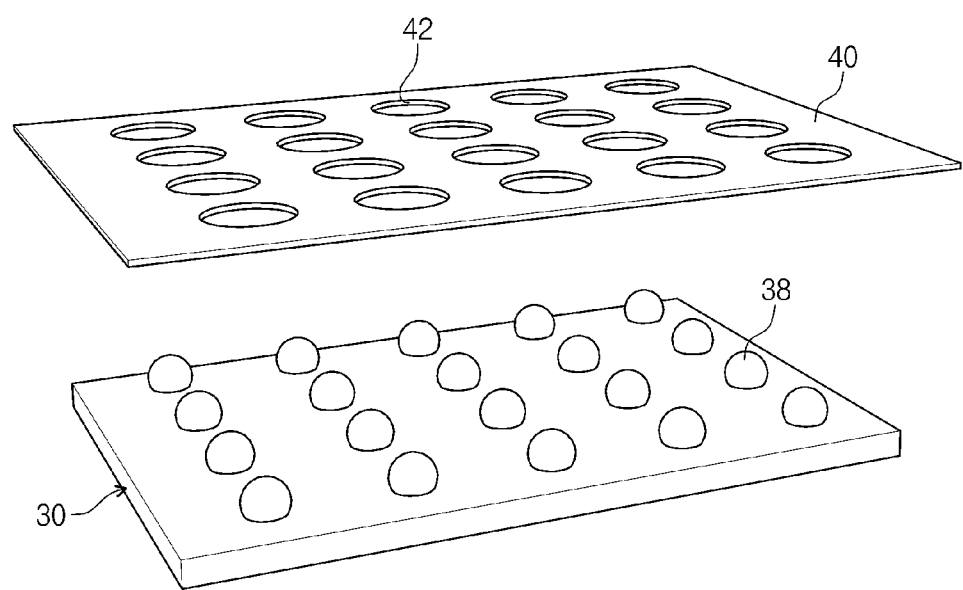
FIGS. 2B, 3B and 4B are perspective views illustrating a method of operating the portion of the apparatus configured to attach a solder ball of FIG. 1B.
Figure 3A:
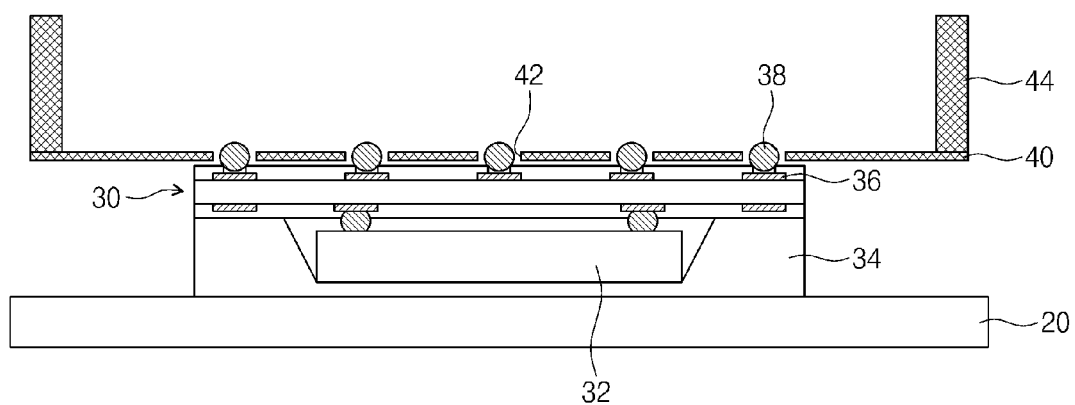
Figure 3B:
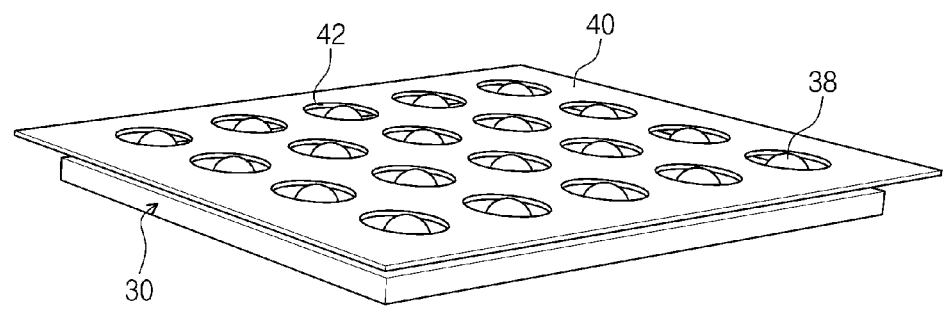
Figure 4A:
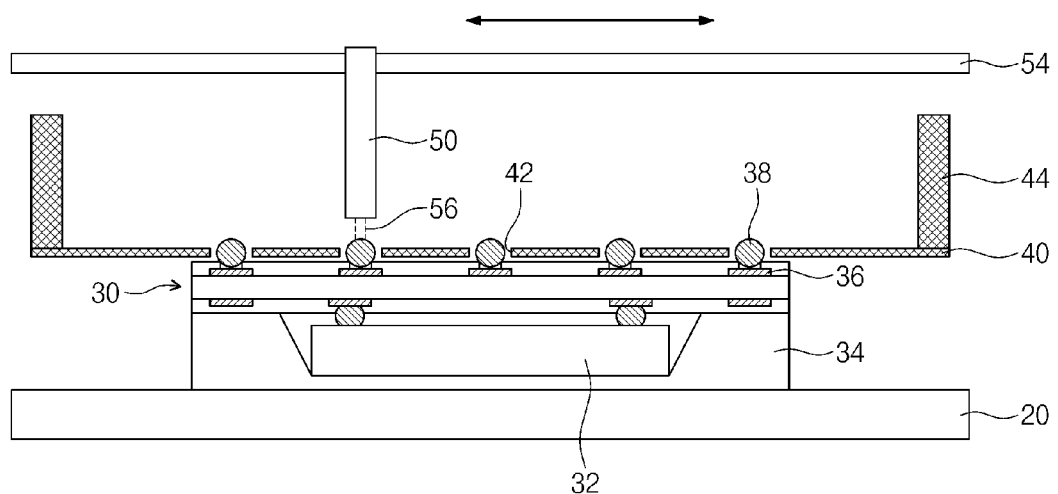
Figure 4B:
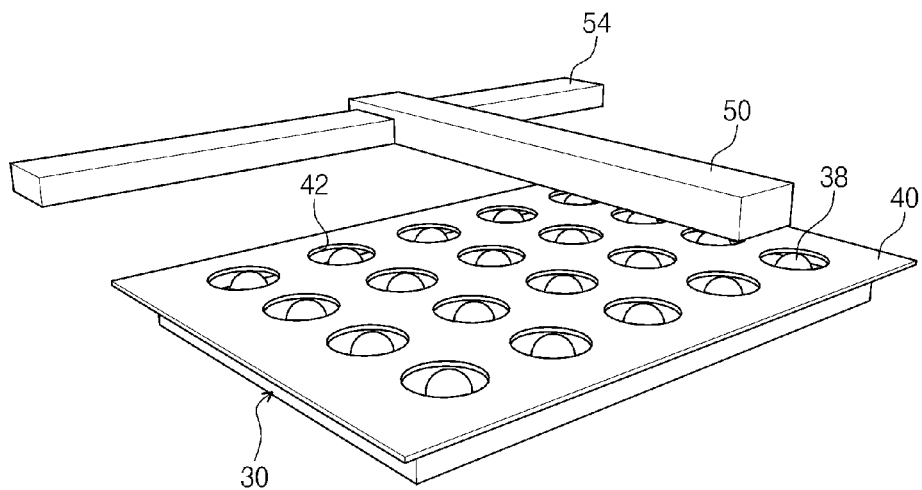

FIGS. 2A, 3A and 4A are cross-sectional views illustrating a method of operating the apparatus configured to attach a solder ball of FIG. 1A. FIGS. 2B, 3B and 4B are perspective views illustrating a method of operating the portion of the apparatus configured to attach a solder ball of FIG. 1B.

Referring to FIGS. 2A and 2B, a semiconductor chip 32 may be mounted on the package substrate 30. The package substrate 30 includes ball lands 36. The package substrate 30 and the semiconductor chip 32 may be covered with a mold layer 34. The package substrate 30 is fixed on the chuck 20 with the ball lands 36 facing upward. Solder balls 38 are located on the ball lands 38, respectively. Subsequently, a flux agent may be coated on surfaces of the solder balls 38.

Referring to FIGS. 3A and 3B, the shielding mask 40 is moved down using the first guide 44 such that the positions of the holes 42 correspond to the positions of the solder balls 38, respectively. At this time, the shielding mask 40 may be nearest to the package substrate 30. Some of the solder balls 38 may be inserted into corresponding ones of the holes 42.

Referring to FIGS. 4A and 4B, the heating unit 50 may irradiate light 56 such as the laser beam, the infrared ray or the visible ray or may emit heat. If the intensity of the light 56 or the heat is great, the solder ball 38 receiving the light 56 or the heat may be almost instantaneously melted. Thus, the solder ball 38 may be bonded to the ball land 36. The heating unit 50 may be moved from one end portion to another end portion of the package substrate 30 by the second guide 54. The light or the heat may pass through only the holes 42 according to the movement of the heating unit 50. The light 56 or the heat may not pass through the shielding mask 40 where the holes 42 are not formed. In other words, the light 56 or the heat may be shielded by the shielding mask 40 where the holes 42 are not formed. Thus, the solder balls 38 may be adhered to the package substrate 30.

An experiment was performed using the apparatus 100 configured to attach a solder ball. As a result of the experiment, it was observed that a surface temperature of the solder ball 38 was equal to or greater than 230° C., and a surface temperature of the chuck 20 was equal to or less than about 100° C. Thus, it is confirmed that the solder ball 38 is selectively heated by the shielding mask 40.

In the method of attaching the solder ball according to the aforementioned exemplary embodiment, the solder balls 38 may be selectively heated using the shielding mask 40 including the holes 42 exposing the solder balls 38. Thus, it is possible to reduce or minimize thermal damage of the semiconductor chip 32 mounted on the package substrate 30. In particular, if the semiconductor chip 32 is a memory chip (e.g., a dynamic random access memory (DRAM) device or a magnetic RAM (MRAM) device) which may be easily deteriorated by heat, the method of attaching the solder ball according to the exemplary embodiments may be very useful in a method of fabricating a semiconductor package including the semiconductor chip 32. In the DRAM device, a dielectric layer of a capacitor may be deteriorated by a high temperature such that a capacitance of the capacitor may be reduced. In the MRAM device, a magnetic tunnel junction pattern may be adversely affected by a high temperature.

Figure 5A:
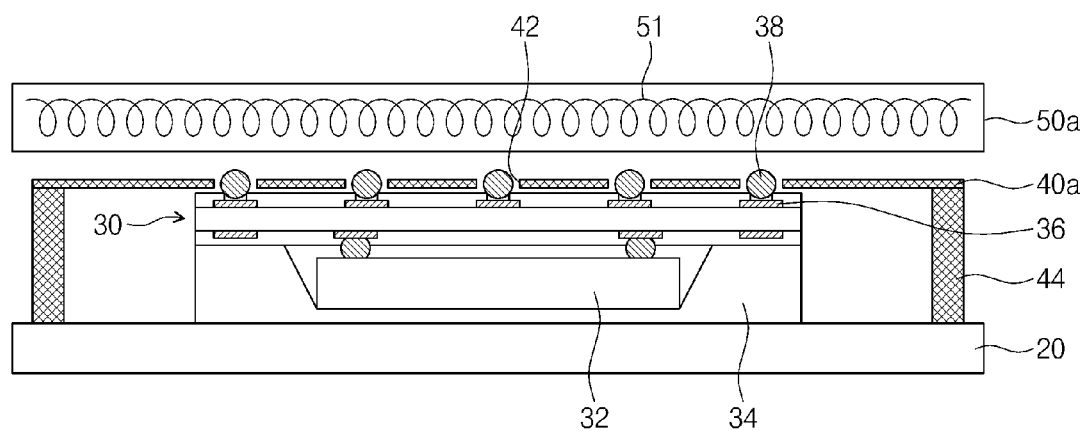
FIG. 5A is a cross-sectional view illustrating an apparatus configured to attach a solder ball according to another exemplary embodiment.
Figure 5B:
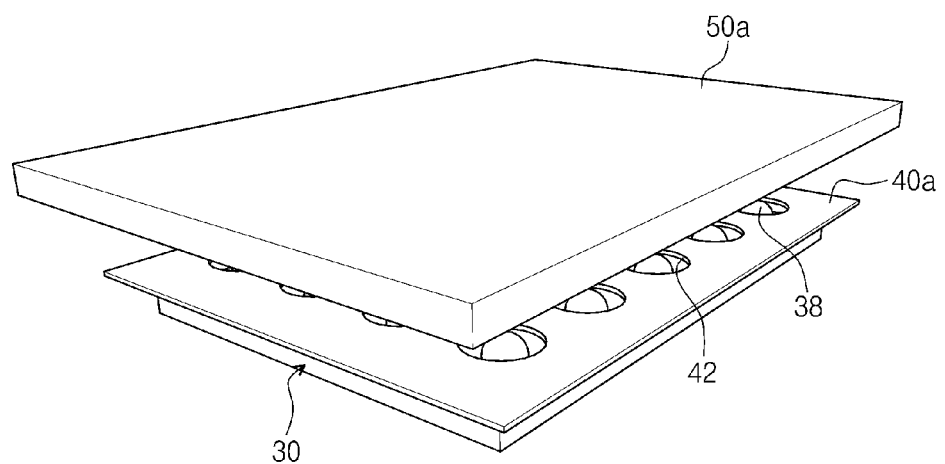
FIG. 5B is a perspective view illustrating a portion of an apparatus configured to attach a solder ball according to another exemplary embodiment.

FIG. 5A is a cross-sectional view illustrating an apparatus configured to attach a solder ball according to another exemplary embodiment. FIG. 5B is a perspective view illustrating a portion of an apparatus configured to attach a solder ball according to another exemplary embodiment.

Referring to FIGS. 5A and 5B, a heating unit 50a may have a plate-shape covering an entire portion of a package substrate 30. The heating unit 50a according to the present exemplary embodiment may be the light generating unit configured to emit at least one of the laser beam, the infrared ray, and the visible ray, as described above. Alternatively, the heating unit 50a may be a heat generating unit including a heating coil 51. If the heating unit 50a is the heat generating unit including the heating coil 51, a shielding mask 40a may include a heat resistant material. Thus, heat generated from the heating unit 50a may be irradiated through holes 42 of the shielding mask 40a to selectively melt the solder balls 38, and the heat may be shielded by the shielding mask 40a in a place where the holes 42 do not exist. In the present exemplary embodiment, the first guide 44 may be in contact with the chuck 20. Thus, the first guide 44 may protect a sidewall of the semiconductor chip 32 such that it is possible to prevent the heat generated from the heating unit 50a from being transferred to the sidewall of the semiconductor chip 32.

A fabricating method of a semiconductor package using the apparatus configured to attach the solder ball according to another exemplary embodiment will be described hereinafter.

Figure 6:
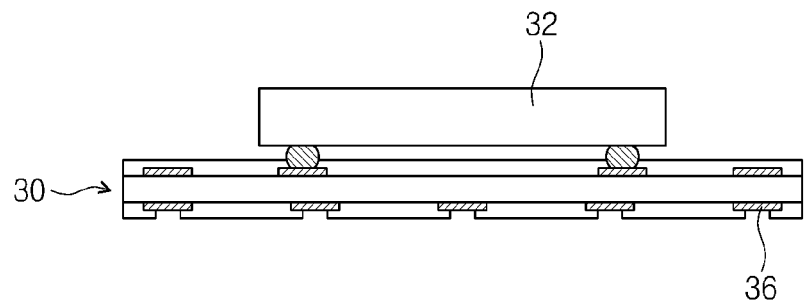
FIGS. 6, 7 and 8 are cross-sectional views illustrating a method of fabricating a semiconductor package according to an exemplary embodiment.
Figure 7:
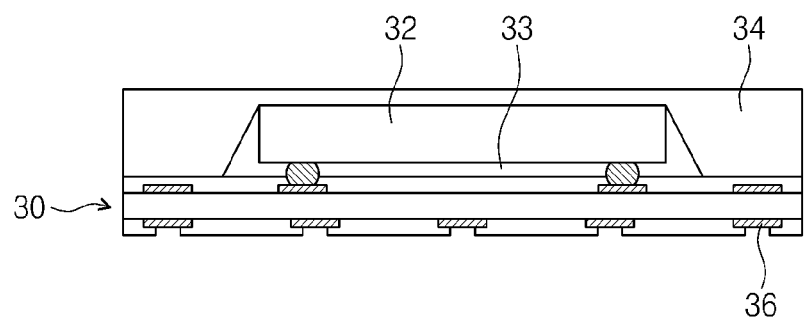
Figure 8:
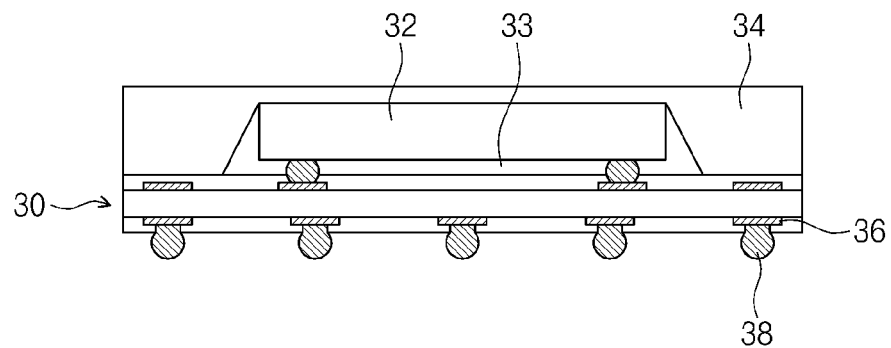

FIGS. 6, 7 and 8 are cross-sectional views illustrating a method of fabricating a semiconductor package according to an exemplary embodiment.

Referring to FIG. 6, a semiconductor chip 32 is mounted on a package substrate 30 including ball lands 36 disposed on a bottom surface of the substrate 30 by a flip chip bonding technique. The semiconductor chip 32 may be a memory chip such as a DRAM device or a MRAM device.

Referring to FIG. 7, an underfill resin layer 33 is formed to fill a space between the semiconductor chip 32 and the package substrate 30. A molding layer 34 is formed to cover the semiconductor chip 32 and the package substrate 30.

Referring to FIG. 8, the package substrate 30 is loaded in the chamber 10 of the apparatus 100 configured to attach the solder ball illustrated in FIGS. 1A and 1B. Subsequently, the solder balls 38 are bonded to the ball lands 36, respectively, as described above. Next, unit semiconductor packages may be separated from each other by a singulation process or some other identification process.

If the semiconductor chip 32 is a memory chip (e.g. the DRAM device or the MRAM) which may be easily deteriorated by heat, the attaching method to attach the solder ball according to the exemplary embodiments may be applied to the method of fabricating the semiconductor package, so that a yield of the semiconductor packages may increase.

FIGS. 9, 10, 11, 12, 13 and 14 are cross-sectional views illustrating a method of fabricating a package-on-package device according to another exemplary embodiment.

Figure 9:
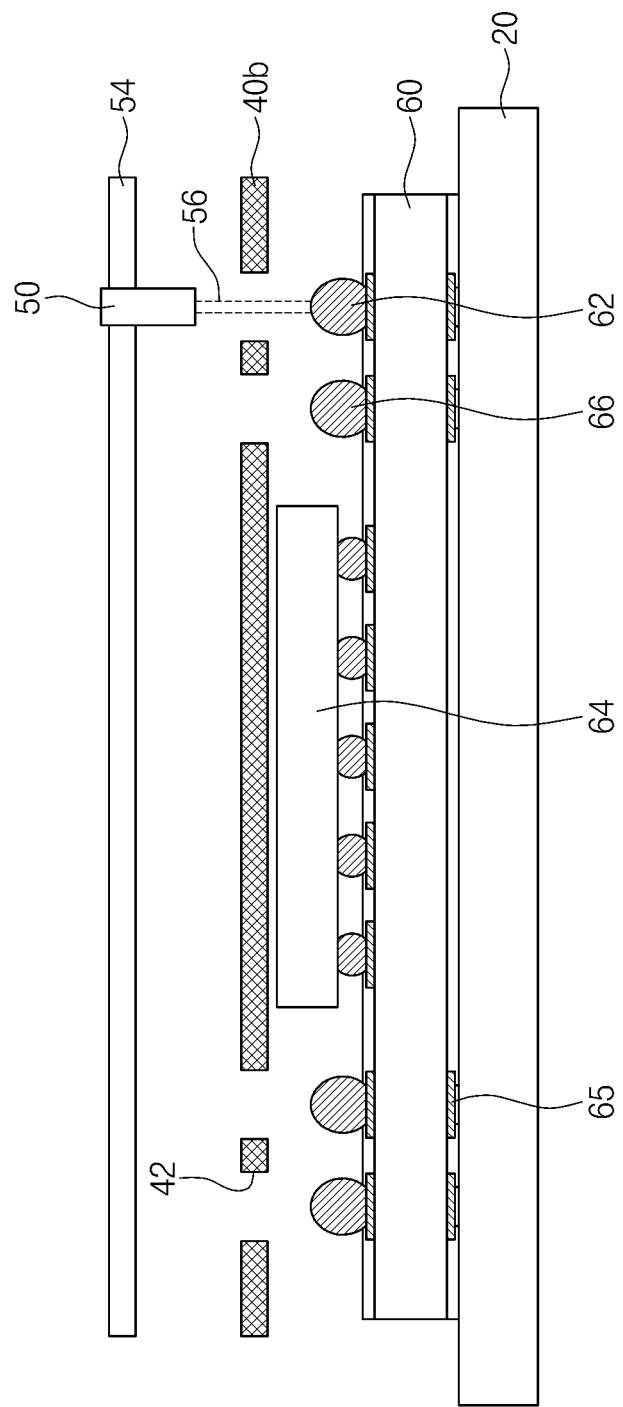
FIGS. 9, 10, 11, 12, 13 and 14 are cross-sectional views illustrating a method of fabricating a package-on-package device according to another exemplary embodiment.

Referring to FIG. 9, a lower semiconductor chip 64 is mounted on a lower package substrate 60 including first lower ball lands 62 and second lower ball lands 65 by, for example, a flip chip bonding technique. First solder balls 66 are provided on the first lower ball lands 62, and a flux agent is coated on surfaces of the first solder balls 66. Next, the lower package substrate 60 is fixed on the chuck 20 of the apparatus 100 configured to attach the solder ball of FIGS. 1A and 1B. Subsequently, the first solder balls 66 are bonded to the first lower ball lands 62 by a first shielding mask 40*b* and the heating unit 50. The lower semiconductor chip 64 may be a logic chip.

Figure 10:
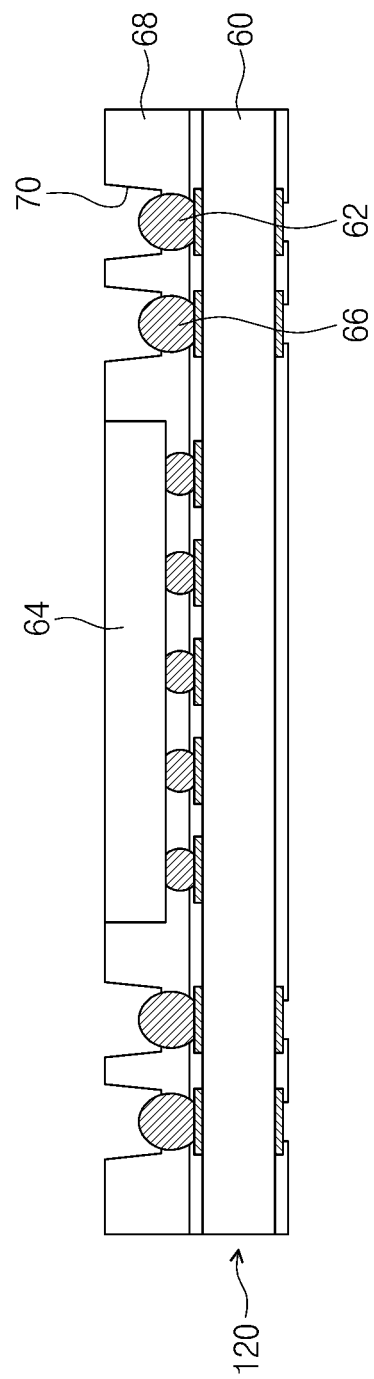

Referring to FIG. 10, the lower package substrate 60 is unloaded to the outside of the apparatus 100 configured to attach the solder ball. A lower molding layer 68 is formed to cover a sidewall of the lower semiconductor chip 64 and the lower package substrate 60. Portions of the lower molding layer 68 are removed to form connecting holes 70 exposing the first solder balls 66. Thus, a lower semiconductor package 120 is prepared.

Figure 11:
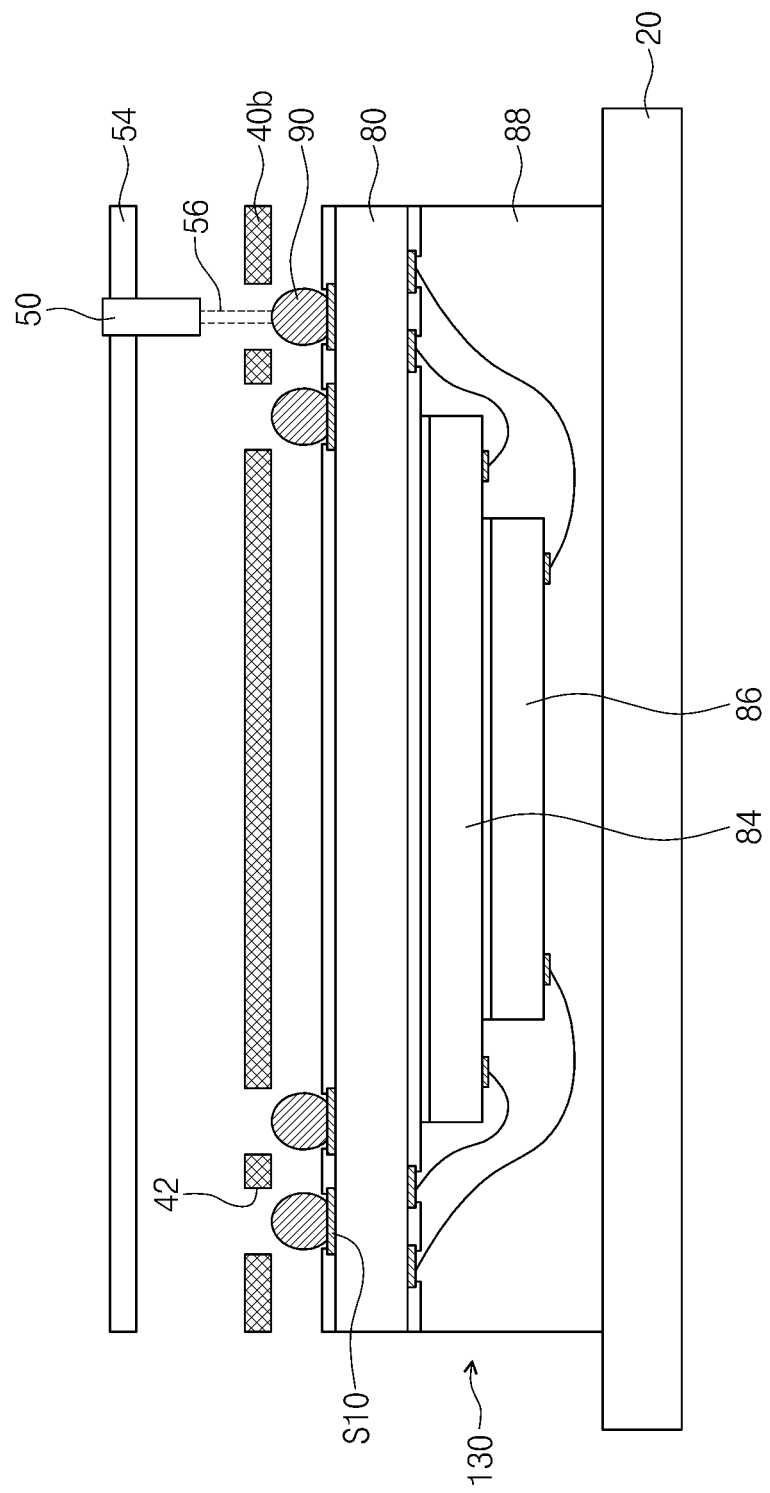

Referring to FIG. 11, upper semiconductor chips 84 and 86 are mounted on an upper package substrate 80 including upper ball lands 82 by, for example, a wire bonding technique. An upper mold layer 88 is formed to cover the upper semiconductor chips 84 and 86 and the upper package substrate 80. Second solder balls 90 are put on the upper ball lands 82, and a flux agent is then coated on surfaces of the second solder balls 90. Next, the upper package substrate 80 is fixed on the chuck 20 of the apparatus 100 of FIGS. 1A and 1B. Subsequently, the second solder balls 80 are bonded to the upper ball lands 82 by the first shielding mask 40*b* and the heating unit 50. The upper semiconductor chips 84 and 86 may be memory chips, although are not limited thereto. Thus, an upper semiconductor package 130 is prepared.

Figure 12:
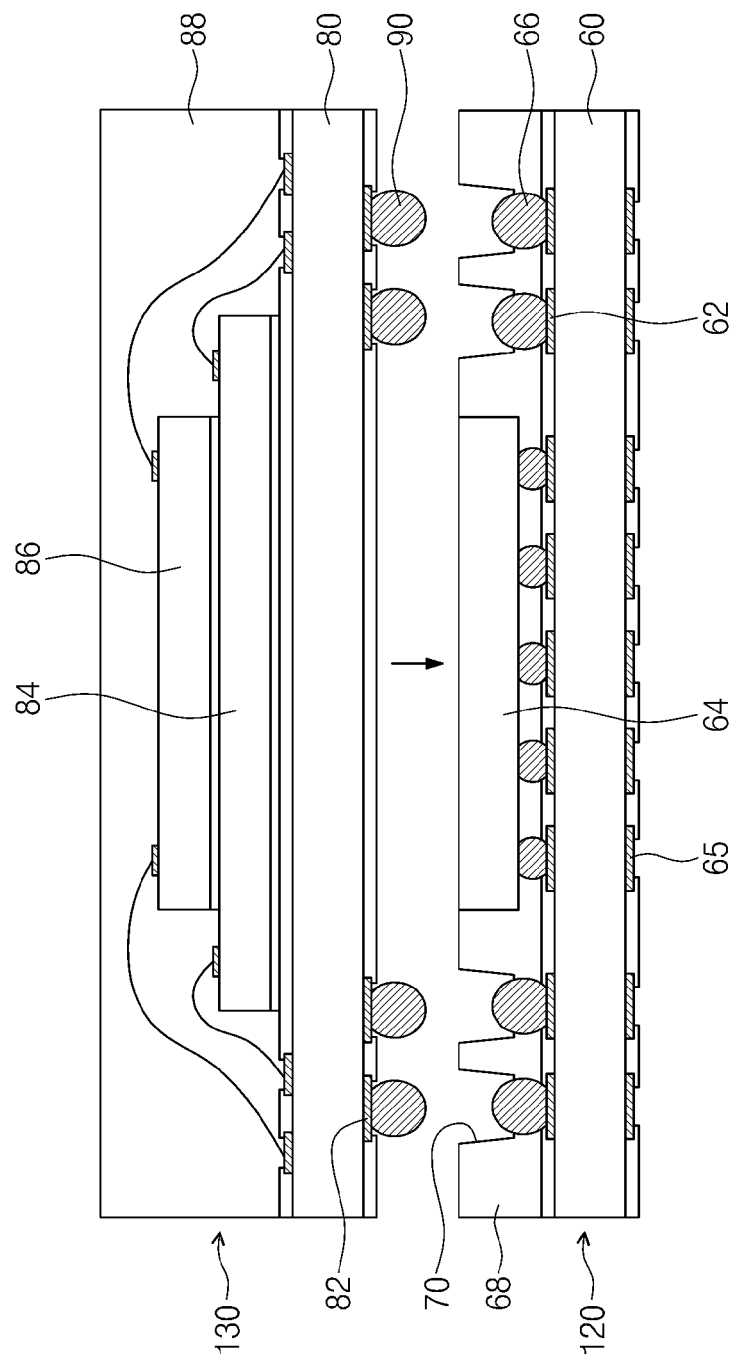

Referring to FIG. 12, a flux agent is coated on surfaces of the first and second solder balls 66 and 90. Subsequently, the upper semiconductor package 130 is provided on the lower semiconductor package 120. The second solder balls 90 are provided in the connecting holes 70, respectively, so that the second solder balls 90 come in contact with the first solder balls 66, respectively. Next, the first and second solder balls 66 and 90 are heated to bond the second solder balls 90 to the first solder balls 66, respectively. At this time, the second solder balls 90 and the first solder balls 66 may be heated by, for example, a hot air process using the hot air type apparatus, or another type of heating technique.

Figure 13:
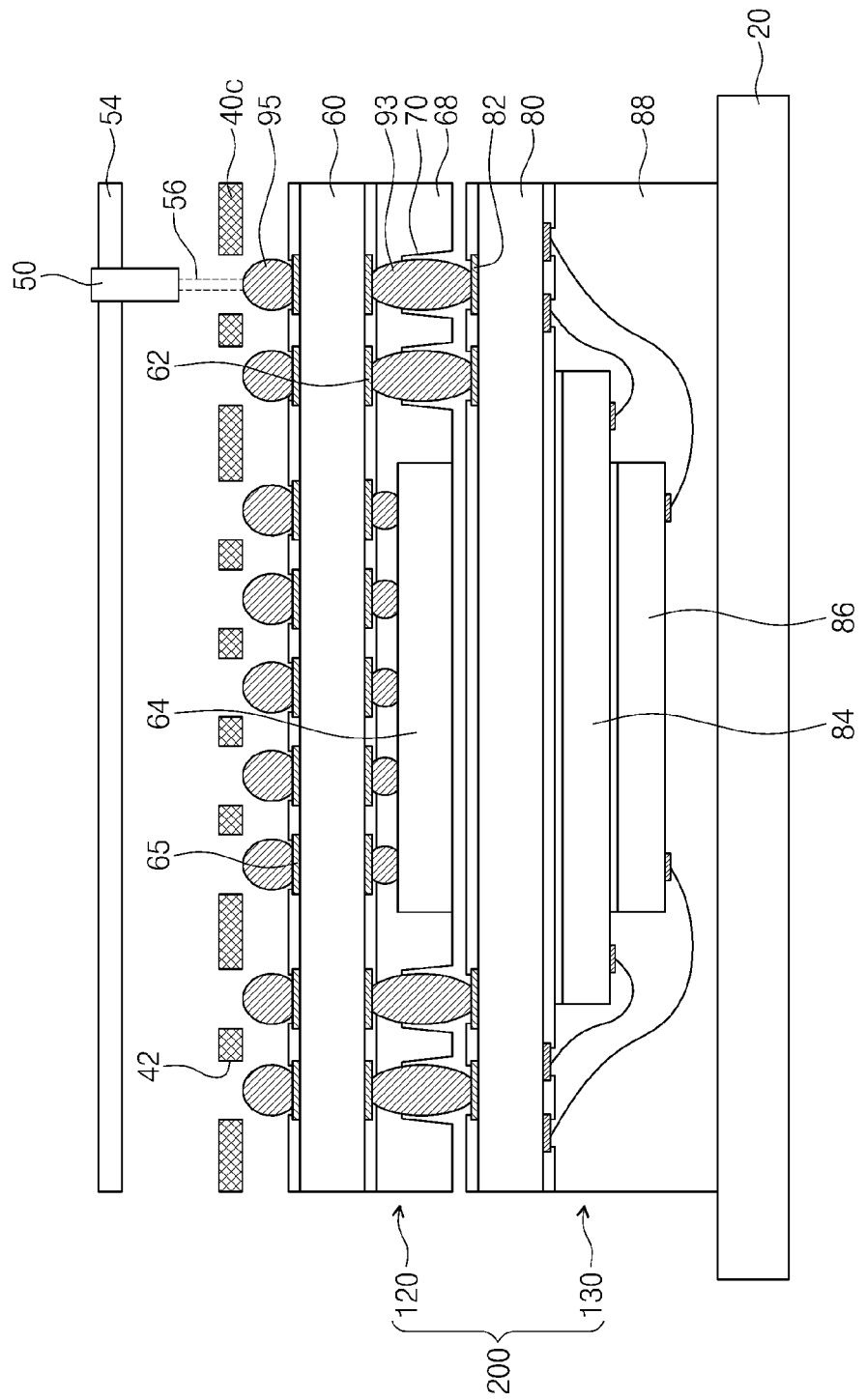

Referring to FIG. 13, each of the first solder balls 66 and each of the second solder balls 90 may be bonded to each other to form one connecting solder ball 93. Thus, the lower semiconductor package 120 is electrically connected to the upper semiconductor package 130. A package-on-package (PoP) device 200 including the lower and upper semiconductor packages 120 and 130 may be overturned such that the second lower ball lands 65 may face upwards. Third solder balls 95 are located on the second lower ball lands 65, respectively. After a flux agent is coated on surfaces of the third solder balls 95, the PoP device 200 is fixed on the chuck 20 of the apparatus 100 of FIGS. 1A and 1B. Subsequently, the third solder balls 95 are bonded to the second lower ball lands 65 by a second shielding mask 40*c* and the heating unit 50.

Figure 14:
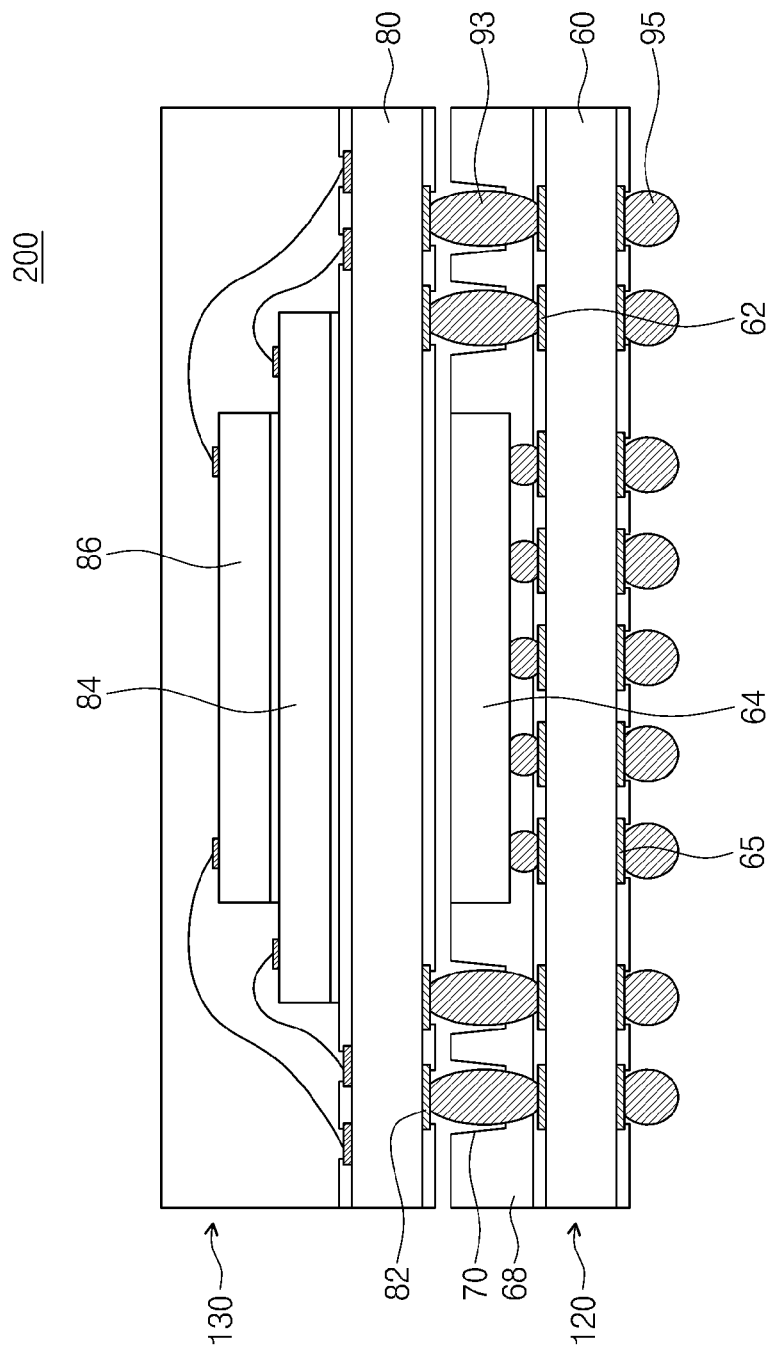

Referring to FIG. 14, the PoP device 200 is unloaded from the apparatus 100 configured to attach the solder ball. Thus, the PoP device 200 may be fabricated.

Even though the hot air process is described as being used in the process of bonding the first and second solder balls 66 and 90 to each other in the method of fabricating the PoP device according to the present exemplary embodiment, the fabricating method according to the present exemplary embodiment may cause a small or no amount of thermal damage to the upper semiconductor chips 84 and 86 as compared with a fabricating method which uses the hot air process for all solder ball bonding processes. If the hot air process is applied to all solder ball bonding processes of the method of fabricating the PoP device, a thermal stress may be applied to the semiconductor chips 64, 84 and 86 three or more times. However, the method of attaching the solder ball according to the exemplary embodiments may be applied to the method of fabricating the PoP device, so that the number of the hot air process may be reduced. For example, one hot air process may be applied. Thus, the thermal damage of the semiconductor chips 64, 84 and 86 may be reduced to increase the yield of the PoP device 200.

The apparatus configured to attach the solder ball according to the exemplary embodiments may selectively melt only the solder ball using the shielding mask and the heating unit configured to emit the laser or the infrared ray. Thus, the power consumption of the apparatus according to exemplary embodiments may be reduced as compared with the hot air type apparatus which uses the thermal convection effect caused by the heater heating air and the fan. Additionally, the apparatus according to the exemplary embodiments does not use nitrogen, in contrast to the hot air type apparatus which uses nitrogen. Thus, the apparatus according to exemplary embodiments does not incur the cost associated with using nitrogen, and the apparatus according to the exemplary embodiments does not require pipes for the nitrogen, such that a size of the apparatus according to exemplary embodiments may thereby be reduced. Moreover, the apparatus according to the exemplary embodiments does not require a conveyor belt, in contrast to the hot air type apparatus which uses a conveyor belt. Thus, it is possible to prevent position fails of solder balls, which are caused by vibration of the conveyor belt.

In the method of attaching the solder ball according to the exemplary embodiments, only the solder balls may be selectively heated using the shielding mask including the holes exposing the solder balls. Thus, the thermal damage of the semiconductor chip mounted on the package substrate may be reduced. This attaching method may be applied to the method of fabricating the semiconductor package such that the yield of the semiconductor package may increase.

While the exemplary embodiments have been described with reference to certain exemplary embodiments thereof, it will be apparent to those skilled in the art that various changes and modifications may be made without departing from the spirit and scope of the exemplary embodiments. Therefore, it should be understood that the above exemplary embodiments are not limiting, but illustrative. Thus, the scope of the exemplary embodiments is to be determined by the broadest permissible interpretation of the following claims and their equivalents, and shall not be restricted or limited by the foregoing description.

What is claimed is:

1. A method of attaching a solder ball, the method comprising:
   providing solder balls on ball lands mounted on a surface of a package substrate;
   providing a shielding mask on the package substrate, the shielding mask covering the package substrate and comprising a flat surface facing the surface of the package substrate and lying in a plane and holes formed in the plane, and exposing the solder balls such that the solder balls penetrate the plane; and
   melting the solder balls exposed through the holes by a heater configured to bond the solder balls to the ball lands.

2. The method of claim 1, further comprising:
   coating a flux agent on surfaces of the solder balls before performing the melting of the solder balls.

3. The method of claim 1, wherein the heater is a light generator configured to emit a laser beam, an infrared ray, or a visible ray.

4. The method of claim 3, wherein the shielding mask is configured to reflect light.

5. The method of claim 4, wherein the shielding mask comprises at least one of nickel, iron, stainless steel, silver, and titanium.

6. The method of claim 1, wherein the heater comprises a heating coil.

7. The method of claim 6, wherein the shielding mask comprises a heat resistant material.

8. A method of fabricating a semiconductor package, the method comprising:
   mounting a semiconductor chip on a package substrate comprising a surface on which ball lands are mounted; and
   bonding solder balls to the ball lands by:
      providing a shielding mask on the package substrate, the shielding mask covering the package substrate and comprising a flat surface facing the surface of the package substrate and lying in a plane and holes formed in the plane, and exposing the solder balls inserted into the holes; and
   melting the solder balls exposed through the holes by a heater configured to bond the solder balls to the ball lands.

9. The method of claim 8, further comprising:
   forming a mold layer covering the semiconductor chip and the package substrate.

10. The method of claim 8, wherein the semiconductor chip is a memory chip.

* * * * *